(12) United States Patent
Jeong et al.

(10) Patent No.: US 9,029,971 B2
(45) Date of Patent: May 12, 2015

(54) DISPLAY APPARATUS AND METHOD OF MANUFACTURING TOUCH SUBSTRATE

(71) Applicant: Samsung Display Co., Ltd., Yongin (KR)

(72) Inventors: Ki-Hun Jeong, Cheonan-si (KR); Woongkwon Kim, Cheonan-si (KR); Jung Suk Bang, Guri-si (KR); Daecheol Kim, Hwaseong-si (KR); Sungryul Kim, Asan-si (KR); ByeongHoon Cho, Seoul (KR); Sungjin Mun, Seoul (KR); Kun-Wook Han, Seongnam-si (KR)

(73) Assignee: Samsung Display Co., Ltd., Yongin (KR)

( * ) Notice: Subject to any disclaimer, the term of this patent is extended or adjusted under 35 U.S.C. 154(b) by 312 days.

(21) Appl. No.: 13/629,780

(22) Filed: Sep. 28, 2012

(65) Prior Publication Data

US 2013/0075763 A1    Mar. 28, 2013

(30) Foreign Application Priority Data

Sep. 28, 2011    (KR) .................. 10-2011-0098174

(51) Int. Cl.

| H01L 31/00 | (2006.01) |
|---|---|
| H01L 33/48 | (2010.01) |
| H01L 33/00 | (2010.01) |
| G09G 3/00 | (2006.01) |
| G06F 3/041 | (2006.01) |
| G02F 1/133 | (2006.01) |

(52) U.S. Cl.
CPC .............. *H01L 33/48* (2013.01); *H01L 33/005* (2013.01); *G09G 3/00* (2013.01); *G02F 2001/13312* (2013.01); *G06F 2203/04103* (2013.01); *G06F 3/0412* (2013.01)

(58) Field of Classification Search
CPC ....... H01L 33/62; H01L 33/486; H01L 33/60; H01L 2224/48; H01L 2924/01079
USPC ............... 257/81, 98–99, 440, 432, 292, 100, 257/435, 433, 434; 345/174, 42
See application file for complete search history.

(56) References Cited

U.S. PATENT DOCUMENTS

| 2008/0035835 | A1* | 2/2008 | Komatsu et al. ........... 250/208.1 |
|---|---|---|---|
| 2012/0038585 | A1* | 2/2012 | Kim .............................. 345/174 |

* cited by examiner

*Primary Examiner* — Hoa B Trinh
(74) *Attorney, Agent, or Firm* — H.C. Park & Associates, PLC

(57) ABSTRACT

A display apparatus includes a first substrate including a plurality of pixels, and a second substrate facing the first substrate, the second substrate comprising a sensor area and a peripheral area, the sensor area comprising a plurality of sensors. The second substrate includes an insulating layer, and a plurality of lines disposed on the insulating layer corresponding to the peripheral area and connected to the sensors. A void is formed in the insulating layer between two adjacent lines of the plurality of lines at a boundary of the sensor area and the peripheral area.

18 Claims, 10 Drawing Sheets

DISPLAY APPARATUS AND METHOD OF MANUFACTURING TOUCH SUBSTRATE

CROSS-REFERENCE TO RELATED APPLICATION

This application claims priority from and the benefit of Korean Patent Application No. 10-2011-0098174, filed on Sep. 28, 2011, which is incorporated herein by reference for all purposes as if fully set forth herein.

BACKGROUND OF THE INVENTION

1. Field of the Invention

Exemplary embodiments of the present invention relate to a display apparatus. More particularly, exemplary embodiments of the present invention relate to a display apparatus having a sensing function.

2. Discussion of the Background

A touch panel typically allows users to select screens by touching an index screen displayed on an image display apparatus. An image display apparatus employing a touch panel detects a touch position by using the touch panel and is driven in response to an input signal corresponding to the touch position.

An image display apparatus with a touch panel does not need to be connected to independent input devices, such as a keyboard, a mouse, etc., and thus the image display apparatus with the touch panel tends to be widely used.

The touch panel technology, recently, is applied to liquid crystal displays. The touch panel is provided on a substrate, separate from a liquid crystal display panel, or commonly provided on a substrate with the liquid crystal display panel. The liquid crystal display panel coupled with the touch panel may be applied to an all-in-one computer like an in-cell computer.

SUMMARY OF THE INVENTION

Exemplary embodiments of the present invention provide a display apparatus having a sensing function.

Exemplary embodiments of the present invention also provide a method of manufacturing the display apparatus.

Additional features of the invention will be set forth in the description which follows, and in part will be apparent from the description, or may be learned by practice of the invention.

An exemplary embodiment of the prevent invention discloses a display apparatus that includes a first substrate including a plurality of pixels, and a second substrate facing the first substrate, the second substrate comprising a sensor area and a peripheral area, the sensor area comprising a plurality of sensors. The second substrate includes an insulating layer, and a plurality of lines disposed on the insulating layer corresponding to the peripheral area and connected to the sensors. A void is formed in the insulating layer between two adjacent lines of the plurality of lines at a boundary of the sensor area and the peripheral area.

An exemplary embodiment of the present invention also discloses a display apparatus that includes a first substrate comprising a plurality of pixels, and a second substrate facing the first substrate, the second substrate comprising a sensor area and a peripheral area, the sensor area comprising a plurality of sensors. The second substrate includes an insulating layer, and a plurality of lines disposed on the insulating layer corresponding to the peripheral area and connected to the sensors. At least one of the plurality of lines comprises a protruded portion at a boundary of the sensor area and the peripheral area.

An exemplary embodiment of the present invention also discloses a method of manufacturing a touch substrate that includes forming an insulating layer on a base substrate, etching a first portion of the insulating layer, injecting a metal material in the etched first portion to form a metallic layer, forming an organic layer on the insulating layer to partially overlap the first portion in a plan view, forming a conductive layer on the organic layer and the first portion, and etching the metallic layer and the conductive layer to form conductive lines on the organic layer separated from each other at an edge of the organic layer across the first portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
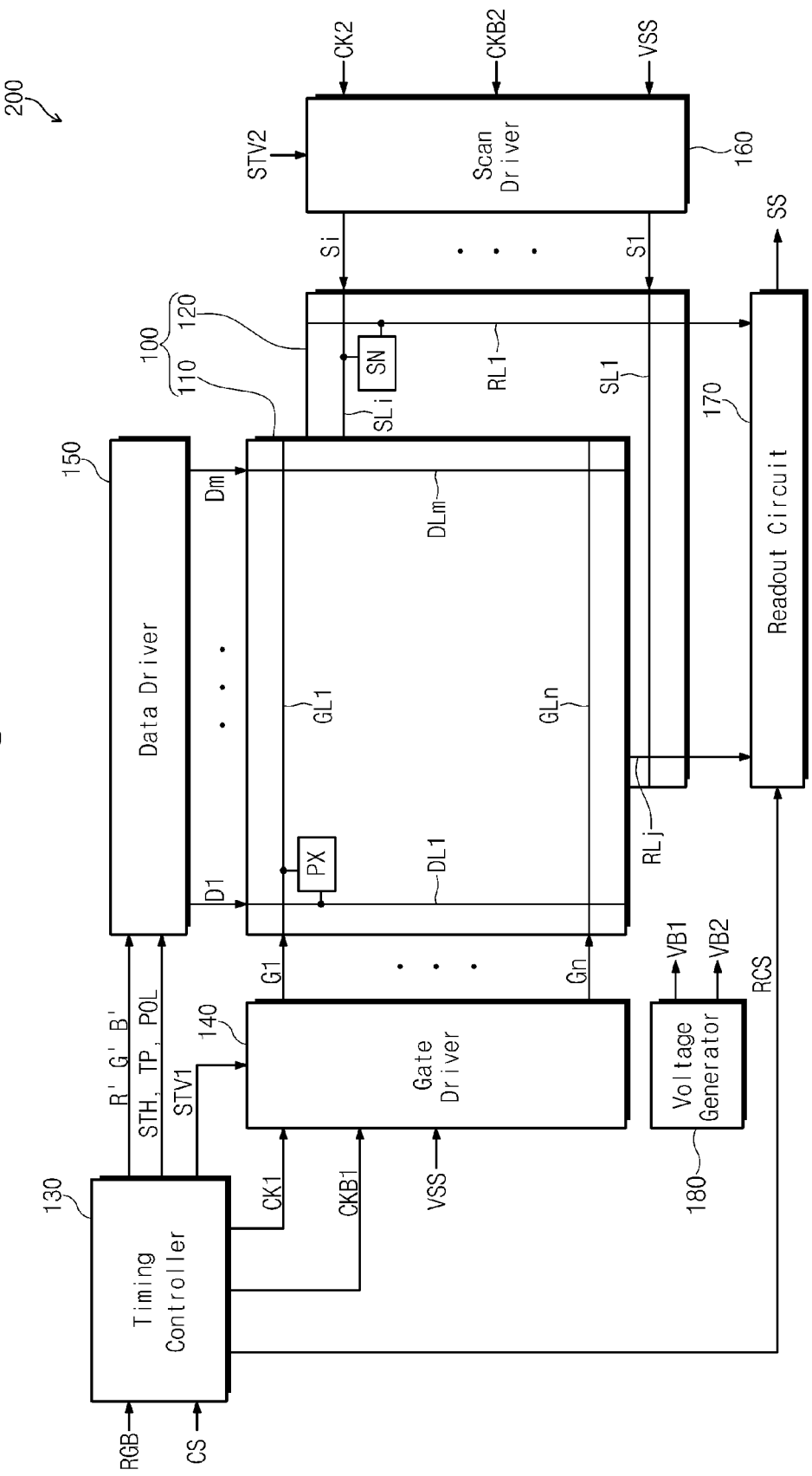
FIG. 1 is a block diagram that illustrates a display apparatus according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art.

In the drawings, the thickness of layers, films, panels, regions, etc., may be exaggerated for clarity. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. In contrast, It will be understood that when an element such as a layer, film, region, or substrate is referred to as being "beneath" another element, it can be directly beneath the other element or intervening elements may also be present. Meanwhile, when an element is referred to as being "directly beneath" another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Hereinafter, exemplary embodiments of the present invention will be explained in detail with reference to the accompanying drawings.

Figure 2:
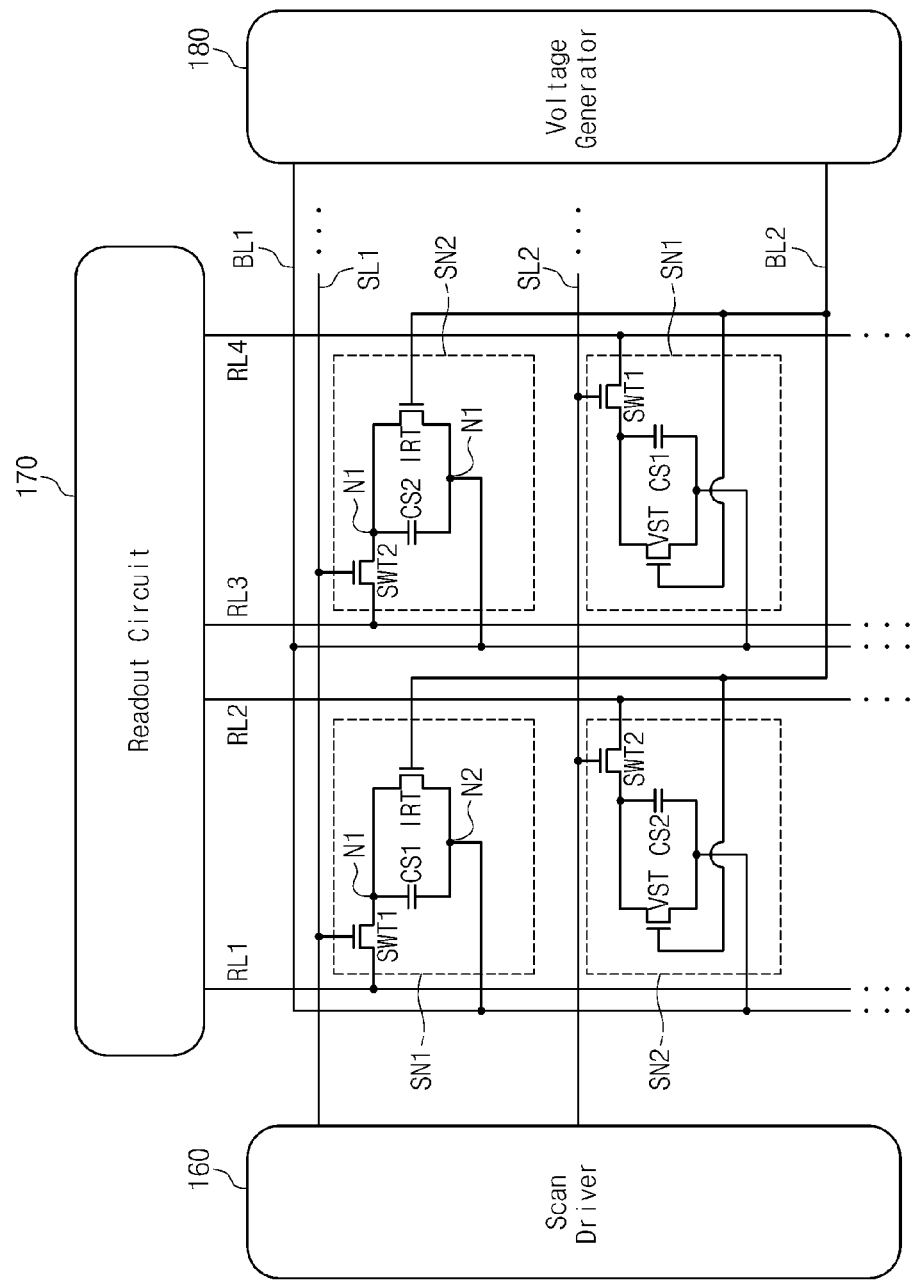
FIG. 2 is a circuit diagram that illustrates a plurality of sensor circuits shown in FIG. 1.

FIG. 1 is a block diagram that illustrates a display apparatus 200 according to an exemplary embodiment of the present invention, and FIG. 2 is a circuit diagram that illustrates a plurality of sensor circuits shown in FIG. 1.

Referring to FIG. 1, a display apparatus 200 may include a display panel 100, a timing controller 130, a gate driver 140, a data driver 150, a scan driver 160, a readout circuit 170, and a voltage generator 180.

According to an exemplary embodiment, the timing controller 130 receives image signals RGB and control signals CS from the outside of the display apparatus 200. The timing controller 130 converts a data format of the image signals RGB to a data format appropriate to an interface between the data driver 150 and the timing controller 130, and applies the converted image signals R'G'B' to the data driver 150. In addition, the timing controller 130 applies data control signals, such as an output start signal TP, a horizontal start signal STH, a polarity inverting signal POL, etc., to the data driver 150 and applies gate control signals, such as a first start signal STV1, a first clock signal CK1, a second clock signal CKB1, etc., to the gate driver 140.

The gate driver 140 sequentially outputs gate signals G1 to Gn to a plurality of gate lines GL1 to GLn in response to the gate control signals STV1, CK1, and CKB1 from the timing controller 130.

The data driver 150 converts the image signals R'G'B' to data voltages D1 to Dm and outputs the data voltages D1 to Dm in response to the data control signals TP, STH, and POL from the timing controller 130.

The display panel 100 may include a first substrate 110, a second substrate 120 facing the first substrate 110, and a liquid crystal layer (not shown) interposed between the first substrate 110 and the second substrate 120. The first substrate 110 includes a plurality of pixels PX, and the second substrate 120 includes a plurality of sensors SN.

In the present exemplary embodiment, the pixels PX have the same structure and function, and thus a pixel PX will be described in detail as a representative example.

The first substrate 110 may include the gate lines GL1 to GLn, the data lines DL1 to DLm crossing the gate lines GL1 to GLn, and the pixels PX. Each pixel PX may include a thin film transistor (not shown) and a pixel electrode (not shown). The thin film transistor may include a gate electrode connected to a corresponding gate line of the gate lines GL1 to GLn, a source electrode connected to a corresponding data line of the data lines DL1 to DLm, and a drain electrode connected to the pixel electrode.

The gate lines GL1 to GLn are connected to the gate driver 140, and the data lines DL1 to DLm are connected to the data driver 150. The gate lines GL1 to GLn receive the gate signals G1 to Gn provided by the gate driver 140 and the data lines DL1 to DLm receive the data voltages D1 to Dm provided by the data driver 150.

Accordingly, the thin film transistor in each pixel PX is turned on in response to the gate signal applied through the corresponding gate line, and the data voltage applied to the corresponding data line is applied to the pixel electrode through the turned-on thin film transistor.

Meanwhile, the second substrate 120 may include a reference electrode that faces the pixel electrodes with the liquid crystal layer being interposed therebetween.

In addition, the second substrate 120 may include a plurality of scan lines SL1 to SLi, a plurality of readout lines RL1 to RLj crossing the scan lines SL1 to SLi, and a plurality of sensors SN.

In FIG. 2, for the convenience of explanation, first and second scan lines SL1 and SL2 have been shown among the scan lines SL1 to SLi and first, second, third, and fourth readout lines RL1, RL2, RL3, and RL4 have been shown among the readout lines RL1 to RLj.

Referring to FIG. 2, the sensors SN may include at least two types of sensors. For instance, the sensors SN may include a plurality of first sensors SN1 to sense a first light having an infrared ray wavelength, and a plurality of second sensors SN2 to sense a second light having a visible light wavelength.

Each of the first sensors SN1 may include a first switching transistor SWT1, a first sensor transistor IRT, and a first capacitor CS1. The first switching transistor SWT1 may include a gate electrode connected to a corresponding scan line of the scan lines SL1 to SLi, a source electrode connected to a corresponding readout line of the readout lines RL1 to RLj, and a drain electrode connected to the first capacitor CS1 and the first sensor transistor IRT.

The first capacitor CS1 may include a first electrode connected to the drain electrode of the first switching transistor SWT1, and a second electrode to receive a first bias voltage VB1 through a first bias line BL1. In the present exemplary embodiment, the first bias voltage VB1 may be about −4 volts.

The first sensor transistor IRT may include a gate electrode to receive a second bias voltage VB2 through a second bias line BL2, a source electrode connected to the drain electrode of the first switching transistor SWT1, and a drain electrode to receive the first bias voltage VB1. The second bias voltage VB2 has a voltage level lower than that of the first bias voltage VB1. As an example, the second bias voltage VB2 may be about −9 volts.

The first sensor transistor IRT generates a photocurrent corresponding to an amount of the first light incident from the outside. The first light may have the infrared ray wavelength. Due to the photocurrent generated by the first sensor transistor IRT, the voltage is charged in the first capacitor CS1 increases. That is, as the amount of the first light incident to the first sensor transistor IRT increases, the voltage charged in the first capacitor CS1 increases. Thus, the first sensor SN1 may sense the first light.

Meanwhile, each of the second sensors SN2 may include a second switching transistor SWT2, a second sensor transistor VST, and a second capacitor CS2. The second switching transistor SWT2 may include a gate electrode connected to a corresponding scan line of the scan lines SL1 to SLi, a source electrode connected to a corresponding readout line of the readout lines RL1 to RLj, and a drain electrode connected to the second capacitor CS2 and the second sensor transistor VST.

The second capacitor CS2 may include a first electrode connected to the drain electrode of the second switching transistor SWT2, and a second electrode to receive the first bias voltage VB1 through the first bias line BL1.

The second sensor transistor VST includes a gate electrode to receive the second bias voltage VB2 through the second bias line BL2, a source electrode connected to the drain electrode of the second switching transistor SWT2, and a drain electrode to receive the first bias voltage VB1. The second bias voltage VB2 has a voltage level lower than that of the first bias voltage VB1.

The second sensor transistor VST generates a photocurrent corresponding to an amount of the second light incident from the outside. The second light may have the visible light wavelength. Due to the photocurrent generated by the second sensor transistor VST, the voltage charged in the second capacitor CS2 increases. Accordingly, the second sensor SN2 may sense the second light.

Meanwhile, the scan lines SL1 to SLi are connected to the scan driver 160 to sequentially receive a plurality of scan signals S1 to Si. The scan driver 160 receives scan control signals, such as a second start signal STV2, a third clock signal CK2, a fourth clock signal CKB2, etc., from the timing controller 130 to sequentially output the scan signals S1 to Si. The scan control signals STV2, CK2, and CKB2 may be synchronized with the gate control signals STV1, CK1, and CKB1, respectively.

The readout lines RL1 to RLj are connected to the readout circuit 170 to provide the voltage charged in the corresponding sensors SN1 and SN2 to the readout circuit 170.

The voltage generator 180 generates voltages required to drive the display apparatus 200. In the present exemplary embodiment, the voltage generator 180 generates the first and second bias voltages VB1 and VB2 respectively applied to the first and second sensors SN1 and SN2 through the first and second bias lines BL1 and BL2.

As shown in FIG. 2, the first sensors SN1 are alternately arranged with the second sensors SN2 in a first direction in which the scan lines SL1 to SLi extend and in a second direction in which the readout lines RL1 to RLj extend.

Particularly, in the present exemplary embodiment, a (4k−3)th (k is a natural number equal to or larger than 1) readout line (e.g., the first readout line RL1 in FIG. 2) and 4k-th readout line (e.g., the fourth readout line RL4 in FIG. 2) among the readout lines RL1 to RLj are connected to respective first sensors SN1. In addition, a (4k−2)th readout line (e.g., the second readout line RL2 in FIG. 2) and a (4k−1)th readout line (e.g., the third readout line RL3 in FIG. 2) among the readout lines RL1 to RLj are connected to respective second sensors SN2.

When the first and second switching transistors SWT1 and SWT2 are turned on in response to the corresponding scan signals applied to the corresponding scan lines, each of the first and second sensors SN1 and SN2 provides the voltages charged in the first and second capacitors CS1 and CS2 to the readout lines through the turned-on switching transistors SWT1 and SWT2.

The readout circuit 170 sequentially provides the voltages SS from the readout lines RL1 to RLj to the timing controller 130 in response to a control signal RCS applied from the timing controller 130. The timing controller 130 may generate a two-dimensional coordinate value with respect to a touch position on a screen or an object to be scanned based on a time point at which the scan signal is generated and the voltages SS from the readout circuit 170.

Figure 3:
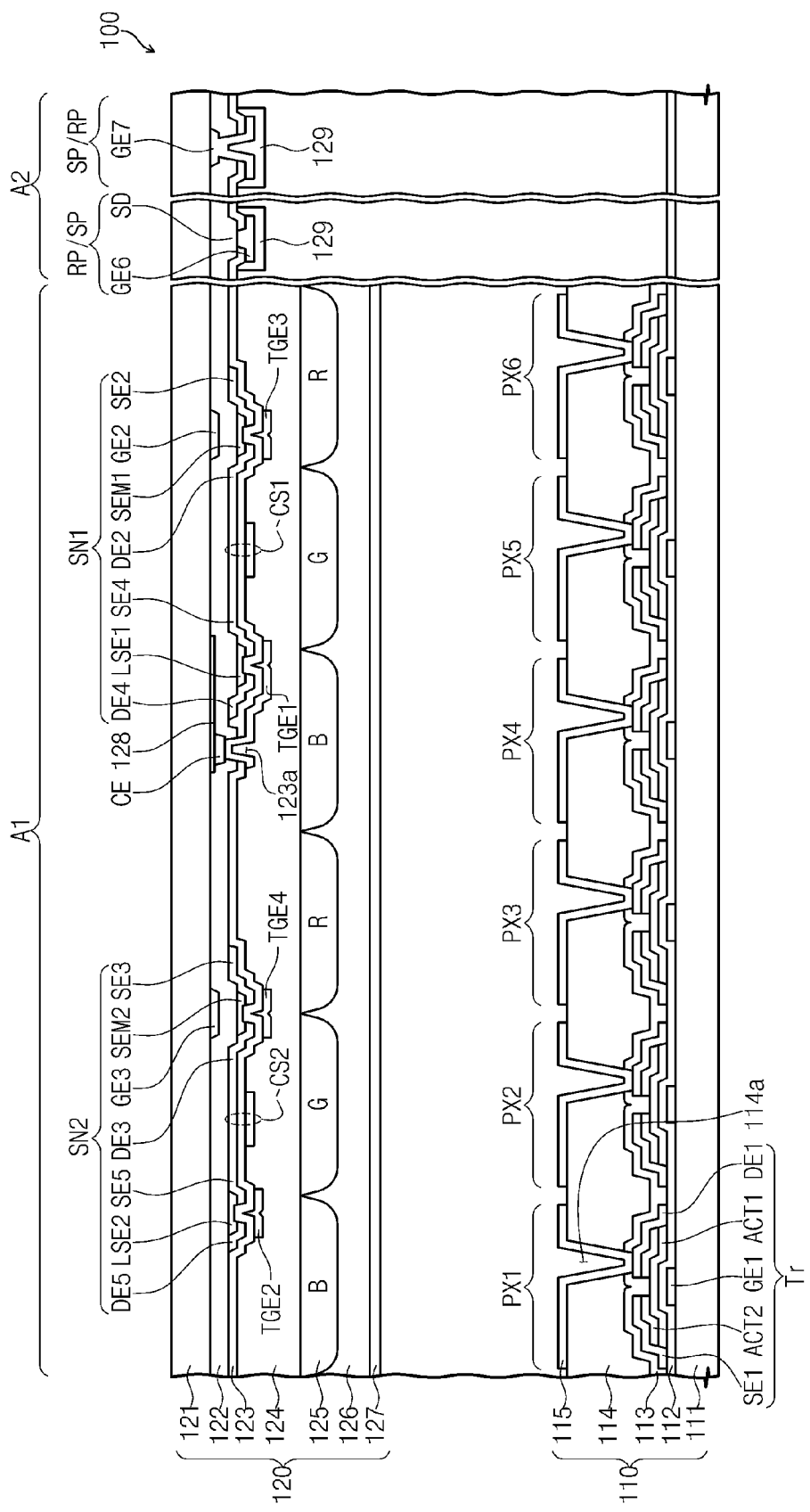
FIG. 3 is a cross-sectional view that illustrates a display panel according to an exemplary embodiment of the present invention.

FIG. 3 is a cross-sectional view that illustrates a display panel according to an exemplary embodiment of the present invention.

Referring to FIG. 3, the display panel 100 may include the first substrate 110, the second substrate 120 facing the first substrate 110, and the liquid crystal layer interposed between the first substrate 110 and the second substrate 120.

The first substrate 110 may include a first base substrate 111 and the pixels PX disposed on the first base substrate 111. Each pixel PX includes the thin film transistor Tr and the pixel electrode 115.

FIG. 3 shows six pixels PX1 to PX6 arranged in the first direction. The six pixels PX1 to PX6 have the same structure and function, and thus one pixel will be described in detail.

The gate electrode GE1 of the thin film transistor Tr is disposed on the first base substrate 111. The gate electrode GE1 is covered by a first gate insulating layer 112.

An active layer ACT1 and an ohmic contact layer ACT2 are disposed on the first gate insulating layer 112 to face the gate electrode GE1. Then, the source electrode SE1 and the drain electrode DE1, which are spaced apart from each other by a certain distance, are disposed on the active layer ACT1. The source and drain electrodes SE1 and DE1 are covered by a first protective layer 113, and an organic insulating layer 114 is disposed on the first protective layer 113.

The first protective layer 113 and the organic insulating layer 114 have a contact hole 114a formed therethrough to expose the drain electrode DE1. The pixel electrode 115 is disposed on the organic insulating layer 114, and electrically connected to the drain electrode through the contact hole 114a.

Meanwhile, a sensor area A1 of the second substrate 120 includes a second base substrate 121, the sensors SN disposed on the second base substrate 121, a color filter layer 125 including color pixels R, G, and B respectively corresponding to the pixels PX, and the reference electrode 127. A peripheral area A2 of the second substrate 120 includes a plurality of readout pads RP and a plurality of scan pads SP, which are disposed on the second base substrate 121.

The sensors SN are formed in the sensor area A1 of the second base substrate 121. The sensors SN include the first sensor SN1 and the second sensor SN2. The first sensor SN1 includes the first switching transistor SWT1, the first capacitor CS1, and the first sensor transistor IRT. The second sensor SN2 includes the second switching transistor SWT2, the second capacitor CS2, and the second sensor transistor VST.

The first and second sensors SN1 and SN2 have substantially the same structure, so that the first and second sensors SN1 and SN2 may be formed through the same process.

In detail, gate electrodes GE2 and GE3 of the first and second switching transistors SWT1 and SWT2 are formed in the sensor area A1 of the second base substrate 121.

The gate electrodes GE2 and GE3 of the first and second switching transistors SWT1 and SWT2 are covered by a second gate insulating layer 122. A semiconductor layer SEM1 of the first switching transistor SWT1 and a semiconductor layer SEM2 of the second switching transistor SWT2 are disposed on the second gate insulating layer 122. The semiconductor layers SEM1 and SEM2 are made of amorphous silicon.

In addition, a first light sensing layer LSE1 of the first sensor transistor IRT and a second light sensing layer LSE2 of the second sensor transistor VST are disposed on the second gate insulating layer 122. The first light sensing layer LSE1 may include silicon germanium (SiGe) which reacts with the first light having the infrared ray wavelength and the second light sensing layer LSE2 may include amorphous silicon (a-Si) which reacts with the second light having the visible light wavelength.

The second substrate 120 may further include an infrared ray filter 128 to block the second light and transmit the first light. The infrared ray filter 128 may be disposed between the second base substrate 121 and the second insulating layer 122 to correspond to the first light sensing layer LSE1. As an example, the infrared ray filter 128 may include silicon germanium (SiGe).

Source and drain electrodes SE2 and DE2, which are spaced apart from each other by a certain distance, are disposed on the semiconductor layer SEM1 of the first switching transistor SWT1. Source and drain electrodes SE3 and DE3, which are spaced apart from each other by a certain distance, are disposed on the semiconductor layer SEM2 of the second switching transistor SWT2. The fabrication of the first and second switching transistors SWT1 and SWT2 may thus be completed.

Meanwhile, source and drain electrodes SE4 and DE4 are disposed on the first light sensing layer LSE1 of the first sensor transistor IRT to be spaced apart from each other, and source and drain electrodes SE5 and DE5 are disposed on the second light sensing layer LSE2 of the second sensor transistor VST to be spaced apart from each other.

In the present exemplary embodiment, the source electrode SE4 of the first sensor transistor IRT is electrically connected to the drain electrode DE2 of the first switching transistor SWT1 and serves as the first electrode of the first capacitor CS1.

In addition, the source electrode SE5 of the second sensor transistor VST is electrically connected to the drain electrode DE3 of the second switching transistor SWT2 and serves as the first electrode of the second capacitor CS2.

The source and drain electrodes SE2 and DE2 of the first switching transistor SWT1, the source and drain electrodes SE3 and DE3 of the second switching transistor SWT2, the source and drain electrodes SE4 and DE4 of the first sensor transistor IRT, and the source and drain electrodes SE5 and DE5 of the second sensor transistor VST are covered by a second protective layer 123.

The gate electrode TGE1 (hereinafter, referred to as first top gate) of the first sensor transistor IRT and the gate electrode TGE2 (hereinafter, referred to as second top gate) of the second sensor transistor VST are disposed on the second protective layer 123.

In addition, the second electrode of the first capacitor CS1 and the second electrode of the second capacitor CS2 are disposed on the second protective layer 123.

In the present exemplary embodiment, the first switching transistor SWT1 may further include a dummy gate electrode TGE3 (third top gate) disposed on the second protective layer 123 and electrically connected to the gate electrode GE2. In addition, the second switching transistor SWT2 may further include a dummy gate electrode TGE4 (fourth top gate) disposed on the second protective layer 123 and electrically connected to the gate electrode GE3.

As shown in FIG. 3, the first top gate TGE1 of the first sensor transistor IRT may be electrically connected to the infrared ray filter 128. In detail, a connection electrode CE is disposed on the infrared ray filter 128, which is formed by the same process as the gate electrode GE2 of the first switching transistor SWT1. The second gate insulating layer 122 and the second protective layer 123 include a second contact hole 123a to expose the connection electrode CE, and the first top gate TGE1 is electrically connected to the connection electrode CE through the second contact hole 123a.

The first and second top gates TGE1 and TGE2 of the first and second sensor transistors IRT and VST and the dummy gate electrodes TGE3 and TGE4 of the first and second switching transistors SWT1 and SWT2 are covered by a second organic insulating layer 124. The color filter layer 125 is disposed on the second organic insulating layer. The color filter layer 125 includes red, green, and blue color pixels R, G, and B, and each of the red, green, and blue color pixels R, G, and B may correspond to one pixel.

An organic layer 126 is disposed on the color filter layer 125. The organic layer 126 may be an overcoating layer. The organic layer 126 compensates for a step difference caused by the color filter layer 125 to allow layers formed thereon to be flat. The reference electrode 127 is disposed on the organic layer 126 and the reference electrode 127 may be formed flat by the organic layer 126.

The readout pads RP and the scan pads SP are disposed in the peripheral area A2 of the second base substrate 121. The second gate insulating layer 122 may be formed on the sensor area A1 and the peripheral area A2 of the second base substrate 121. The readout pads RP and the scan pads SP may be disposed on the second gate insulating layer 122. For instance, a source/drain electrode SD and a sixth gate electrode GE6 may be disposed on the second gate insulating layer 122. The source/drain electrode SD and the sixth gate electrode GE6 may form the readout pads RP or the scan pads SP. A seventh gate electrode GE7 may be formed penetrating and on the second gate insulating layer 122. The seventh gate electrode GE7 may form the scan pads SP or the readout pads RP.

A conductive layer 129 is disposed on the sixth gate electrode GE6 and the seventh gate electrode GE7 to protect the scan pads SP and the readout pads RP. The conductive layer 129 may include indium tin oxide or indium zinc oxide.

The sixth gate electrode GE6 or the seventh gate electrode GE7 may include the same material as the first top gate electrode TGE1, the second top gate electrode TGE2, or the third top gate electrode TGE3 in the sensor area A1 of the second base substrate 121. In addition, the sixth gate electrode GE6 or the seventh gate electrode GE7 may be formed together with the first top gate electrode TGE1, the second top gate electrode TGE2, or the third top gate electrode TGE3.

The readout pads RP are connected to the readout circuit 170. For instance, the readout circuit 170 is integrated in a first semiconductor chip, and the first semiconductor chip is connected to the readout pads RP. The scan pads SP are connected to the scan driver 160. That is, the scan driver 160 is integrated in a second semiconductor chip, which is connected to the scan pads SP.

Figure 4:
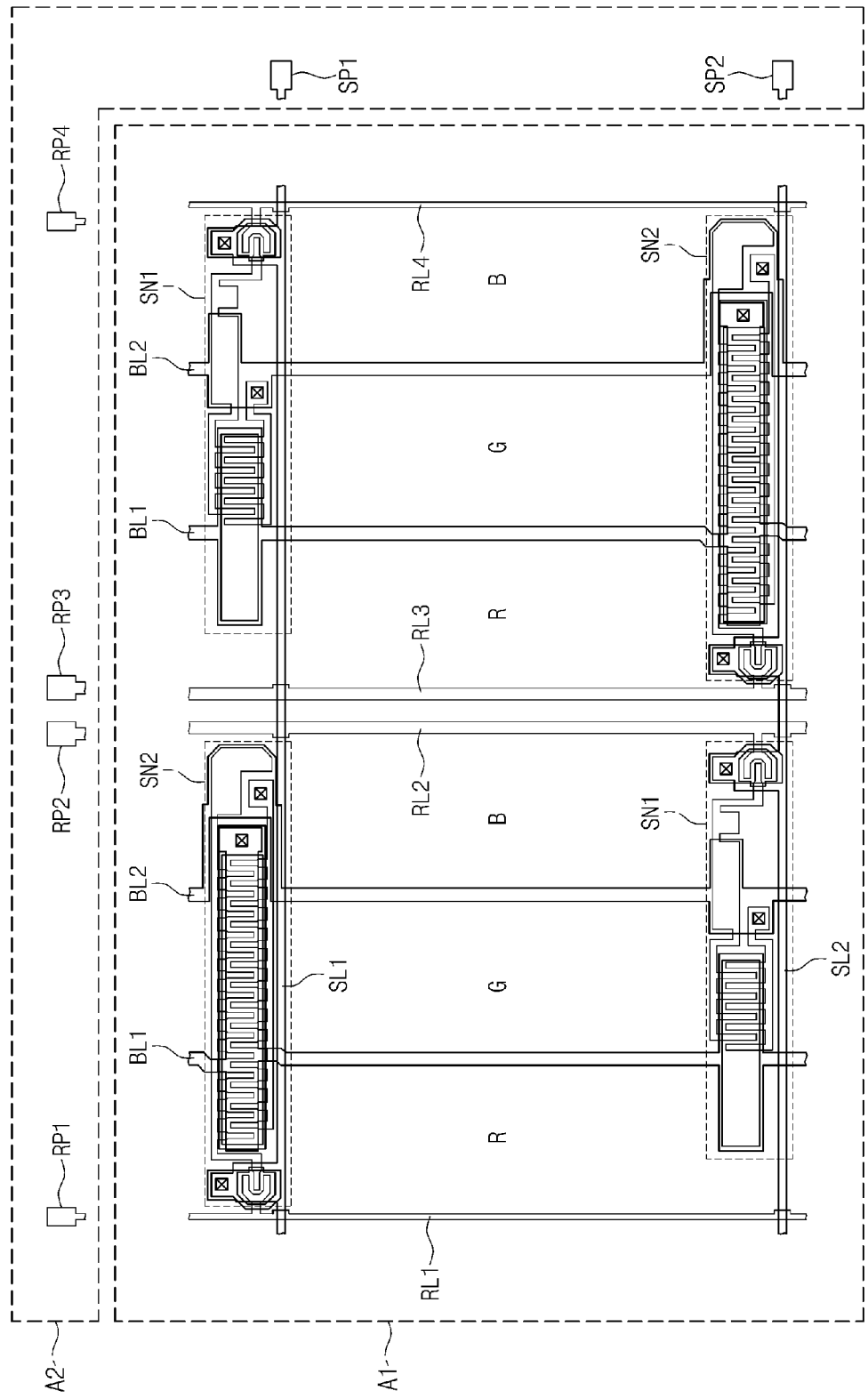
FIG. 4 is a plan view that illustrates a layout of a second substrate according to an exemplary embodiment of the present invention.

In FIG. 3, the sensor area A1, the readout pads RP, and the scan pads SP have been shown together. As shown in FIG. 4, however, the readout pads RP are formed adjacent to a first side portion of the sensor area A1 and the scan pads SP are formed adjacent to a second side portion of the sensor area A1, which is different from the first side portion.

FIG. 4 is a plan view that illustrates a layout of a second substrate according to an exemplary embodiment of the present invention.

Referring to FIG. 4, the second substrate 120 includes the first and second scan lines SL1 and SL2 extending in the first direction, the first to fourth readout lines RL1, RL2, RL3, and RL4 extending in the second direction substantially perpendicular to the first direction, and the first and second bias lines BL1 and BL2 extending in the second direction.

The first and second sensors SN1 and SN2 are alternately arranged with each other in the first and second directions. In the present exemplary embodiment, the first readout line RL1 is connected to the first sensor SN1 and the second readout line RL2 is connected to the second sensor SN2. In addition, the third readout line RL3 is connected to the first sensor SN1 and the fourth readout line RL4 is connected to the second sensor SN2.

Meanwhile, the first bias line BL1 receives the first bias voltage VB1 from the voltage generator 180 to apply the first bias voltage VB1 to the first and second sensors SN1 and SN2. The second bias line BL2 receives the second bias voltage VB2 having the voltage level lower than the first bias voltage VB1 from the voltage generator 180 to apply the second bias voltage VB2 to the first and second sensors SN1 and SN2.

When viewed in a plan view, the first and second bias lines BL1 and BL2 are disposed between the first and second readout lines RL1 and RL2 and between the third and fourth readout lines RL3 and RL4.

Meanwhile, the second substrate 120 further includes the red, green, and blue color pixels R, G, and B. The red, green, and blue color pixels R, G, and B are sequentially arranged in the first direction.

The red, green, and blue color pixels R, G, and B and the first and second sensors SN1 and SN2 are disposed in the sensor area A1 of the second substrate 120. A plurality of pads RP1 to RP4 and SP1 to SP2 are disposed in the peripheral area A2 of the second substrate 120. The first to fourth readout pads RP1 to RP4 are respectively connected to the first to fourth readout lines RL1 to RL4. A plurality of first lines may be provided to the second substrate 120 to connect the first to fourth readout lines RL1 to RL4 in the sensor area A1 and the first to fourth readout pads RP1 to RP4 in the peripheral area A2, respectively. The first lines may have a straight line shape or a curved line shape.

The first and second scan pads SP1 and SP2 are connected to the first and second scan lines SL1 and SL2, respectively. A plurality of second lines may be provided to the second substrate 120 to respectively connect the first and second scan lines SL1 and SL2 in the sensor area A1 and the first and second scan pads SP1 and SP2 in the peripheral area A2. The second lines may have a straight line shape or a curved line shape.

Figure 5:
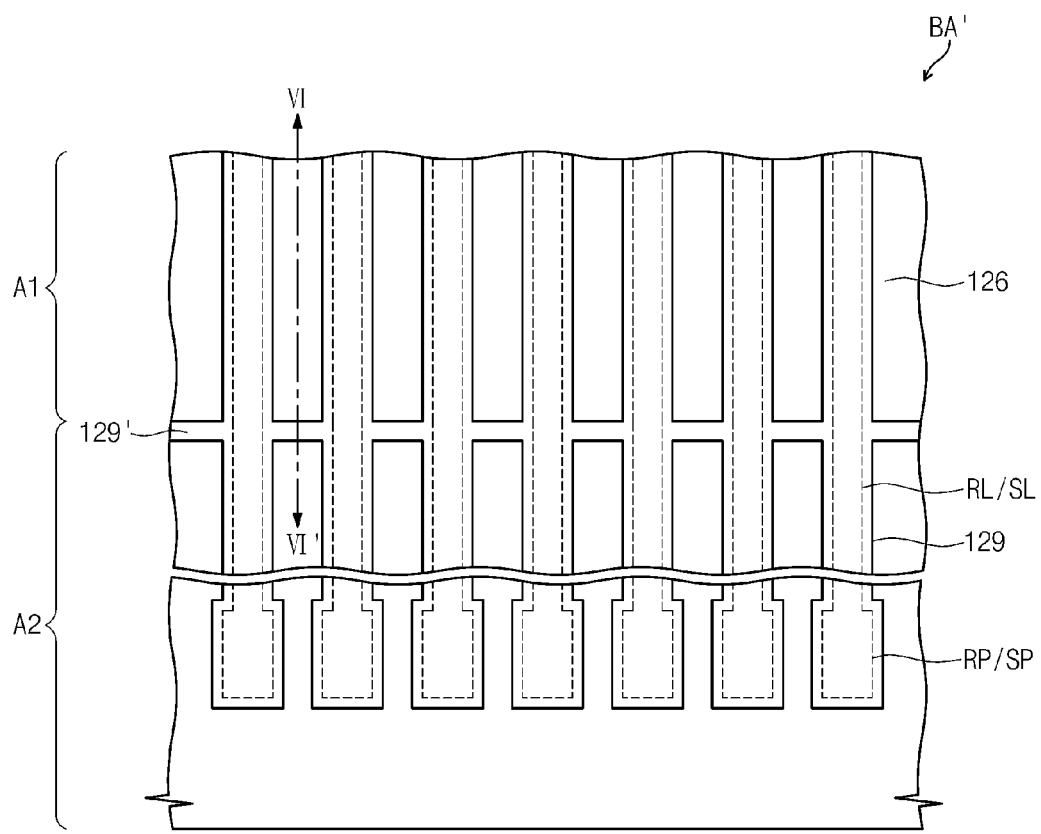
FIG. 5 is a plan view that illustrates a boundary area between a sensor area and a peripheral area of a second substrate shown in FIG. 3 according to an exemplary embodiment of the present invention.

FIG. 5 is a plan view that illustrates a boundary area between a sensor area and a peripheral area of a second substrate shown in FIG. 3 according to an exemplary embodiment of the present invention.

Referring to FIG. 4 and FIG. 5, a plurality of pads RP/SP are disposed in the peripheral area A2 of the second base substrate 121. The pads RP/SP shown in FIG. 5 may be the readout pads RP or the scan pads SP. The pads RP/SP are connected to the plurality of lines RL/SL. The lines RL/SL may be the readout lines RL or the scan lines SL.

The organic layer 126 is disposed on a first portion of the lines RL/SL. For instance, the first portion of the lines RL/SL is disposed in the sensor area A1 and the organic layer 126 is disposed on the first portion of the lines RL/SL in the sensor area A1. The organic layer 126 may be formed over the sensor area A1.

The conductive layer 129 is disposed on a portion of the organic layer 126, which is adjacent to the peripheral area A2, the pads RP/SP, and a second portion of the lines RL/SL, which is not covered by the organic layer 126 to be exposed. The conductive layer 129 may be made of indium tin oxide or indium zinc oxide. The conductive layer 129 may be a coating layer to reduce the likelihood of over-etching of the pads RP/SP and the lines RL/SL.

The conductive layer 129 may be patterned according to the shape of the pads RP/SP and the lines RL/SL after being deposited over the area in which the pads RP/SP and the lines RL/SL are formed. In this case, the conductive layer 129 remains between the lines RL/SL and a residual conductive layer 129' is formed that causes shorting between the patterns of the conductive layer 129.

If the patterns of the conductive layer 129 are shorted to each other by the residual conductive layer 129', the sensors SN1 and SN2 may malfunction.

Figure 6:
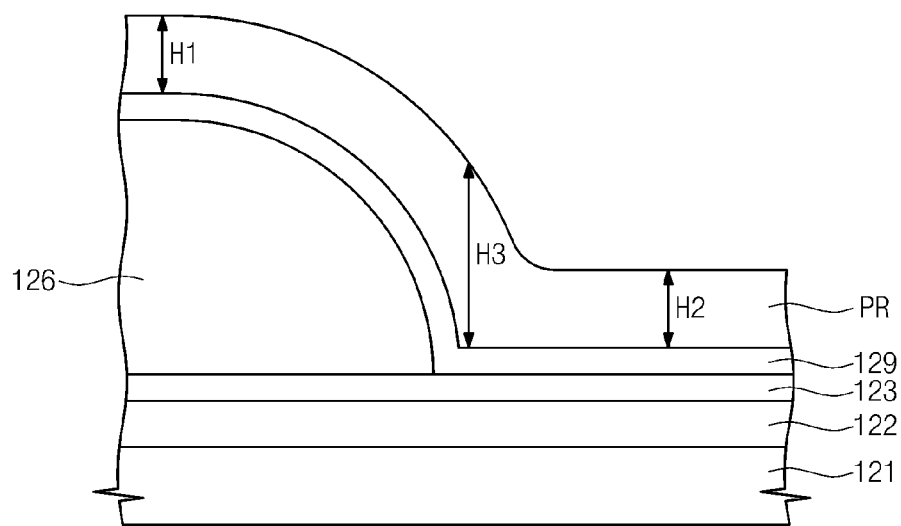
FIG. 6 and FIG. 7 are views that illustrate a conductive layer and a residual conductive layer formed between a readout line and a scan line.
Figure 7:
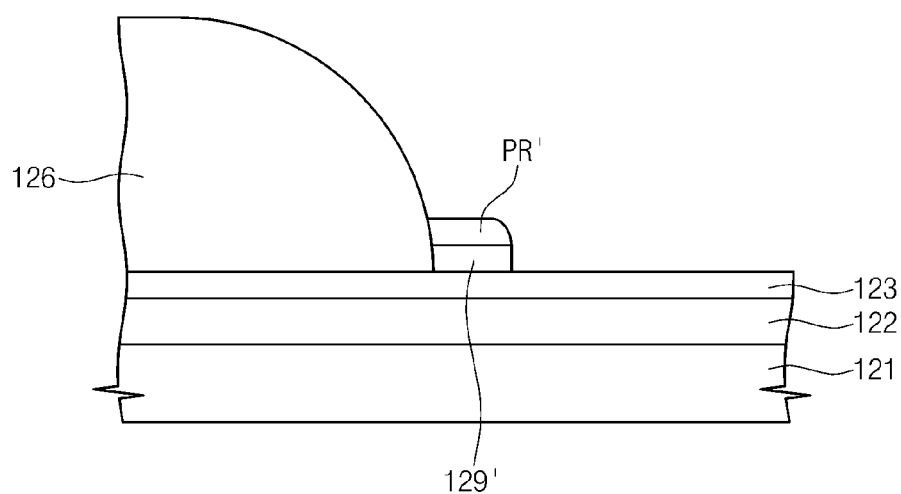

FIG. 6 and FIG. 7 are views that illustrate the conductive layer 129 and the residual conductive layer 129' formed between the readout lines RL and between the scan lines SL. In addition, FIG. 6 and FIG. 7 show a cross-sectional view taken along a line VI-VI' of FIG. 5.

Referring to FIG. 6, the conductive layer 129 is deposited on the organic layer 126, the lines RL/SL, the pads RP/SP, and the second protective layer 123. Then, a photoresist PR is coated on the conductive layer 129 to pattern the conductive layer 129.

The photoresist PR formed on the organic layer 126 of the sensor area A1 has a first height H1. The photoresist PR formed on the second protective layer 123 of the peripheral area A2 has a second height H2 substantially the same as the first height H1. The step difference exists between the organic layer 126 of the sensor area A1 and the second protective layer 123 of the peripheral area A2. Accordingly, the photoresist formed between the organic layer 126 and the pads RP/SP has a third height H3 larger than the first and second heights H1 and H2.

Referring to FIG. 7, the photoresist PR is patterned to pattern the conductive layer 129. However, due to the step difference between the organic layer 126 of the sensor area A1 and the second protective layer 123 of the peripheral area A2, the photoresist PR may not be completely patterned between the organic layer 126 and the pads RP/SP. That is, a residual photoresist PR' may exist. As a result, the residual conductive layer 129', which is not etched, may remain under the residual photoresist PR'.

Figure 8:
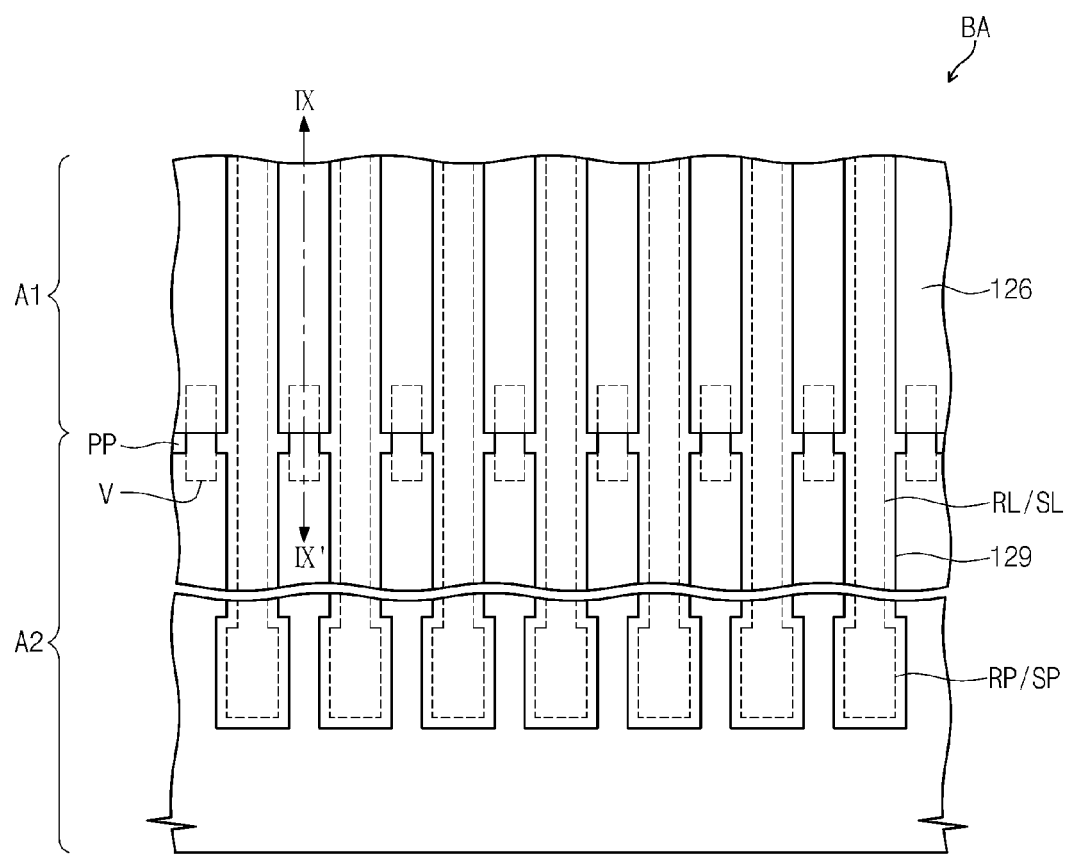
FIG. 8 is a plan view that illustrates a boundary area between a sensor area and a peripheral area of a second substrate shown in FIG. 3 according to another exemplary embodiment of the present invention.

FIG. 8 is a plan view that illustrates a boundary area BA between the sensor area A1 and the peripheral area A2 of the second substrate 120 shown in FIG. 3 according to an exemplary embodiment of the present invention. When compared to the plan view shown in FIG. 5, a plurality of voids V may be formed between the lines RL/SL. The residual conductive layer 129' is removed from the area in which the voids V are formed. Thus, the likelihood of an occurrence of a short between the lines RL/SL may be reduced.

In the case that a width of the voids V is smaller than a distance between the lines RL/SL, the residual conductive layer 129' may be not completely removed. The portion of the residual conductive layer 129', which is not removed, may form a protruded portion PP of the lines RL/SL.

Figure 9:
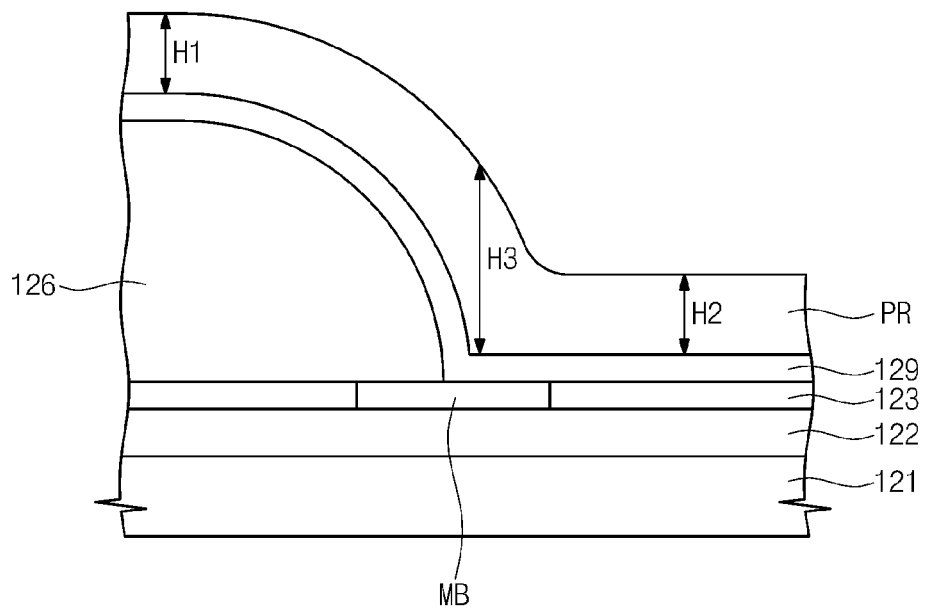
FIG. 9, FIG. 10, and FIG. 11 are views that illustrate a conductive layer and a residual conductive layer formed between a readout line and a scan line.
Figure 10:
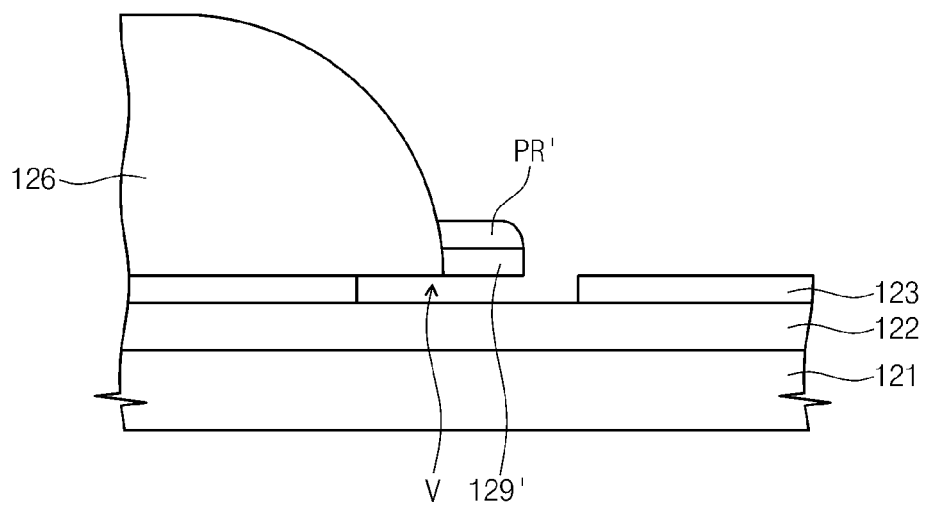
Figure 11:
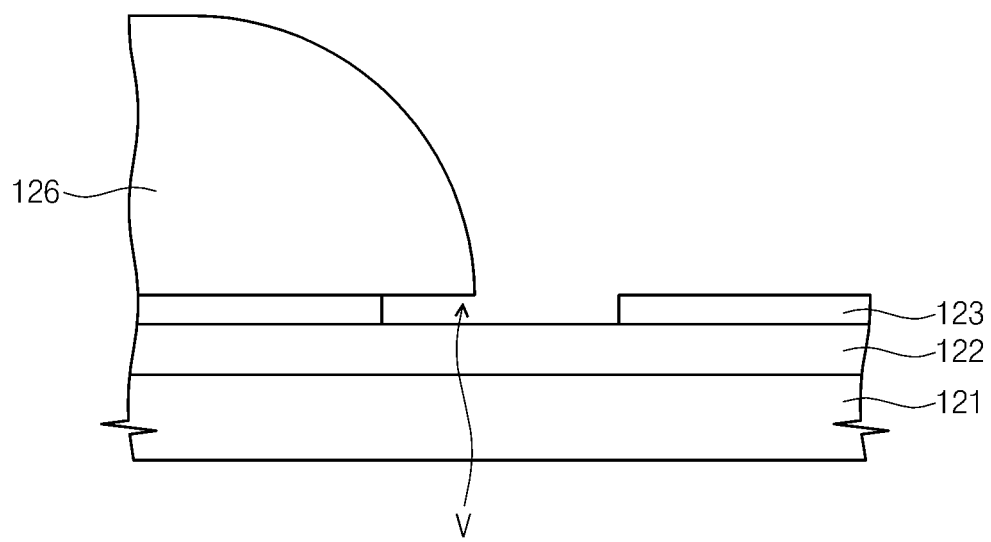

FIG. 9, FIG. 10, and FIG. 11 are views that illustrate the conductive layer 129 and the residual conductive layer 129' formed between the readout lines and the scan lines RL/SL. FIG. 9, FIG. 10, and FIG. 11 show a cross-sectional view taken along a line IX-IX' of FIG. 8.

Referring to FIG. 9, a metal bar MB is disposed between the organic layer 126 and the pads RP/SP. The metal bar MB has the same height as the second protective layer 123. The metal bar MB is formed by etching a portion of the second protective layer 123 and injecting a metal material in the etched portion of the second protective layer 123. The metal bar MB may be a top gate material. The metal bar MB may have a triple-layer structure of molybdenum-aluminum-molybdenum (MAM). The metal bar MB may have a etch rate higher than the conductive layer 129.

The conductive layer 129 is deposited on the organic layer 126, the lines RL/SL, the pads RP/SP, and the second protective layer 123 including the metal bar MB. Then, the photoresist PR is coated on the conductive layer 129 to pattern the conductive layer 129.

Referring to FIG. 10, the photoresist PR is patterned to pattern the conductive layer 129. However, due to the step difference between the organic layer 126 of the sensor area A1 and the second protective layer 123 of the peripheral area A2, the photoresist PR may not be completely patterned between the organic layer 126 and the pads RP/SP. That is, the residual photoresist PR' may exist.

However, the metal bar MB has the etch rate higher than the conductive layer 129. In other words, a material may be used to etch the conductive layer 129 to allow the metal bar MB to be etched faster than the conductive layer 120. For instance, nitrohydrochloric acid (HCl+HNO3+H2O) may be used to etch the conductive layer 129. The nitrohydrochloric acid allows the metal bar MB to be etched a few orders of magnitude faster than the conductive layer 129. Thus, the metal bar MB is etched faster than the conductive layer 129, thereby forming the voids V.

Then, as shown in FIG. 11, the nitrohydrochloric acid is provided to the voids V, and thus the residual conductive layer 129' is etched. In the subsequent processes, the voids V may be filled with a material different from the second protective layer 123. The voids V may be holes formed in the second protective layer 123 and penetrating therethrough. Alternatively, the plurality of voids V may be depressions formed in the second protective layer 123 but do not completely penetrate the second protective layer 123. Also, the voids V may be any combination of such holes and depressions, depending on the embodiments.

Figure 12:
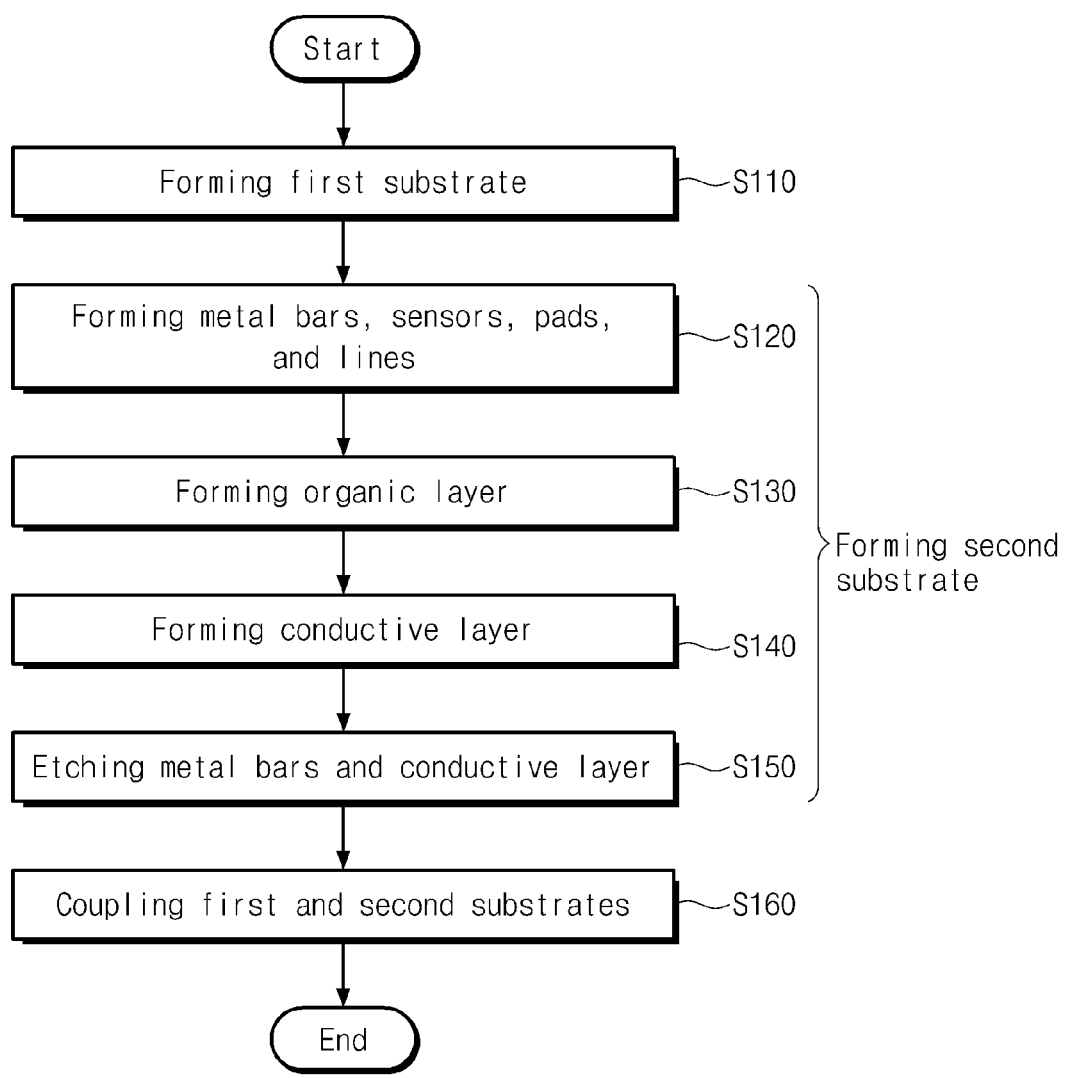
FIG. 12 is a flowchart showing a method of manufacturing a display apparatus according to an exemplary embodiment of the present invention.

FIG. 12 is a flowchart showing a method of manufacturing the display apparatus 200 according to an exemplary embodiment of the present invention.

Referring to FIG. 12, the first substrate 110 including the pixels PX is formed (S110). Then, the second substrate 120 including the sensor area A1 and the peripheral area A2 is formed (S120 to S150).

In detail, the metal bars MB, the sensors SN, the pads RP and SP, and the lines RL and SL are formed on the second base substrate 121 (S120). The organic layer 126 is formed on the sensor area A1 in which the sensors SN are formed (S130). The conductive layer 129 is formed on the metal bars MB, the pads RP and SP, the lines RL and SL, and the portion of the organic layer 126 (S140). Then, the metal bars MB and the conductive layer 129 are etched (S150). The metal bars MB are etched to form the voids V. The conductive layer 129 may be removed from the areas in which the voids V are formed.

Then, the first substrate 110 and the second substrate 120 are coupled with each other to form the display apparatus 200 (S160). In detail, the liquid crystal layer is formed between the first substrate 110 and the second substrate 120, and the first substrate 110, the second substrate 120, the liquid crystal layer, the timing controller 130, the gate driver 140, the data driver 150, the scan driver 160, and the readout circuit 170 may form the display apparatus 200.

Although the exemplary embodiments of the present invention have been described, it will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display apparatus, comprising:
a first substrate comprising a plurality of pixels; and
a second substrate facing the first substrate, the second substrate comprising a sensor area and a peripheral area, the sensor area comprising a plurality of sensors, the second substrate comprising:
an insulating layer; and
a plurality of lines disposed on the insulating layer corresponding to the peripheral area and connected to the sensors,
wherein a void is formed in the insulating layer between two adjacent lines of the plurality of lines at a boundary of the sensor area and the peripheral area.

2. The display apparatus of claim 1, further comprising a plurality of pads connected to the lines.

3. The display apparatus of claim 2, further comprising a conductive layer disposed on the plurality of lines and pads, and the conductive layer does not exist on the void.

4. The display apparatus of claim 3, wherein the conductive layer comprises indium tin oxide or indium zinc oxide.

5. The display apparatus of claim 1, wherein the void is disposed lower than a lower surface of the conductive layer.

6. The display apparatus of claim 1, wherein the void is a hole or a depression in the insulating layer disposed across the boundary of the sensor area and the peripheral area.

7. The display apparatus of claim 2, wherein the sensors and a color filter layer are provided on the insulating layer corresponding to the sensor area and an organic layer is disposed on the sensors and the color filter layer.

8. The display apparatus of claim 7, wherein the sensors comprise a plurality of thin film transistors including a plurality of top gates, and the pads comprise the same material as the top gates.

9. The display apparatus of claim 1, wherein the void is filled with a material different from the insulating layer.

10. The display apparatus of claim 1, wherein the lines comprise a plurality of readout lines and a plurality of scan lines.

11. The display apparatus of claim 6, wherein the void is a hole penetrating the insulating layer.

12. The display apparatus of claim 6, wherein the void is a depression which does not penetrate the insulating layer.

13. The display apparatus of claim 1, further comprising a liquid crystal layer disposed between the first substrate and the second substrate.

14. The display apparatus of claim 1, wherein the sensors are light sensors.

15. A display apparatus comprising:
a first substrate comprising a plurality of pixels; and
a second substrate facing the first substrate, the second substrate comprising a sensor area and a peripheral area, the sensor area comprising a plurality of sensors, the second substrate comprising:
an insulating layer; and
a plurality of lines disposed on the insulating layer corresponding to the peripheral area and connected to the sensors,
wherein at least one of the plurality of lines comprises a protruded portion at a boundary of the sensor area and the peripheral area.

16. The display apparatus of claim 15, wherein a void is formed in the insulating layer between two adjacent lines of the plurality of lines at the boundary of the sensor area and the peripheral area.

17. The display apparatus of claim 16, wherein the protruded portion is adjacent to the void in a plan view.

18. The display apparatus of claim 15, wherein the protruded portion comprises a same material as the plurality of lines.

* * * * *